US010366923B2

(12) United States Patent
Grivna

(10) Patent No.: US 10,366,923 B2
(45) Date of Patent: Jul. 30, 2019

(54) METHOD OF SEPARATING ELECTRONIC DEVICES HAVING A BACK LAYER AND APPARATUS

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/478,839

(22) Filed: Apr. 4, 2017

(65) Prior Publication Data

US 2017/0352593 A1    Dec. 7, 2017

Related U.S. Application Data

(60) Provisional application No. 62/344,725, filed on Jun. 2, 2016.

(51) Int. Cl.
*H01L 21/67* (2006.01)
*H01L 21/304* (2006.01)
(Continued)

(52) U.S. Cl.
CPC ............ *H01L 21/78* (2013.01); *H01L 21/304* (2013.01); *H01L 21/67092* (2013.01);
(Continued)

(58) Field of Classification Search
CPC ............... H01L 21/6836; H01L 23/544; H01L 2223/5446; H01L 2221/68327;
(Continued)

(56) References Cited

U.S. PATENT DOCUMENTS 4,820,377 A    4/1989 Davis et al.
5,075,253 A    12/1991 Sliwa, Jr.
(Continued)

FOREIGN PATENT DOCUMENTS

WO    2001056063 A2    8/2001
WO    2001056063 A3    8/2001
(Continued)

*Primary Examiner* — Moazzam Hossain
*Assistant Examiner* — Stanetta D Isaac
(74) *Attorney, Agent, or Firm* — Kevin B. Jackson

(57) ABSTRACT

A method of singulating a wafer includes providing a wafer having a plurality of die formed as part of the wafer and separated from each other by spaces. The wafer has first and second opposing major surfaces and a layer of material disposed along the second major surface. The method includes placing the wafer onto a carrier substrate and etching through the spaces to form singulation lines, wherein etching comprises stopping atop the layer of material. The method includes providing an apparatus comprising a compression structure, a support structure, and a transducer system configured to apply high frequency mechanical vibrations to the layer of material. The method includes placing the wafer and the carrier substrate onto the support structure, and, in one embodiment, applying pressure and mechanical vibrations to the wafer to separate the layer of material in the singulation lines.

20 Claims, 13 Drawing Sheets

(51) Int. Cl.
*H01L 21/78* (2006.01)
*H01L 21/683* (2006.01)
*H01L 23/544* (2006.01)

(52) U.S. Cl.
CPC ........ *H01L 21/6836* (2013.01); *H01L 23/544* (2013.01); *H01L 2221/68309* (2013.01); *H01L 2221/68327* (2013.01); *H01L 2223/5446* (2013.01)

(58) Field of Classification Search
CPC ......... H01L 21/78–786; H01L 21/3043; B81C 1/00865–00904
See application file for complete search history.

(56) References Cited

U.S. PATENT DOCUMENTS

| | | |
|---|---|---|
| 5,166,097 A | 11/1992 | Tanielian |
| 5,510,655 A | 4/1996 | Tanielian |
| 5,753,418 A | 5/1998 | Tsai et al. |
| 5,856,705 A | 1/1999 | Ting |
| 5,863,813 A | 1/1999 | Dando |
| 6,030,885 A | 2/2000 | Bothra |
| 6,140,151 A | 10/2000 | Akram |
| 6,165,814 A | 12/2000 | Wark et al. |
| 6,200,851 B1 | 3/2001 | Arnold |
| 6,214,703 B1 | 4/2001 | Chen et al. |
| 6,342,724 B1 | 1/2002 | Wark et al. |
| 6,406,979 B2 | 6/2002 | Fischer et al. |
| 6,563,204 B1 | 5/2003 | Glenn |
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,098,077 B2 | 8/2006 | Huang et al. |
| 7,129,114 B2 | 10/2006 | Akram |
| 7,253,477 B2 | 8/2007 | Loechelt et al. |
| 7,309,623 B2 | 12/2007 | Tan et al. |
| 7,335,576 B2 | 2/2008 | David et al. |
| 7,488,688 B2 | 2/2009 | Arita et al. |
| 7,629,228 B2 | 12/2009 | Haji et al. |
| 7,651,925 B2 | 1/2010 | Wyant |
| 7,678,670 B2 | 3/2010 | Arita et al. |
| 7,705,420 B2 | 4/2010 | Joodaki |
| 7,767,551 B2 | 8/2010 | Arita et al. |
| 7,781,310 B2 | 8/2010 | Grivna |
| 7,846,848 B2 | 12/2010 | Lewington et al. |
| 7,883,343 B1 | 2/2011 | Mulligan et al. |
| 7,906,410 B2 | 3/2011 | Arita et al. |
| 7,985,661 B2 | 7/2011 | Grivna |
| 7,989,319 B2 | 8/2011 | Grivna et al. |
| 8,012,857 B2 | 9/2011 | Grivna et al. |
| 8,178,372 B2 | 5/2012 | Lutgen et al. |
| 8,384,231 B2 | 2/2013 | Grivna et al. |
| 8,906,745 B1 | 12/2014 | Lindsey, Jr. et al. |
| 9,418,894 B2 | 8/2016 | Grivna |
| 2003/0207579 A1 | 11/2003 | Rattner et al. |
| 2004/0087062 A1 | 5/2004 | Udrea et al. |
| 2004/0102025 A1 | 5/2004 | Arita |
| 2004/0185580 A1 | 9/2004 | Goh |
| 2005/0072766 A1 | 4/2005 | Arita |
| 2005/0084996 A1 | 4/2005 | Harper |
| 2005/0101109 A1* | 5/2005 | Chin ................ H01L 21/67092 438/464 |
| 2005/0104165 A1 | 5/2005 | Ishio et al. |
| 2005/0142863 A1 | 6/2005 | Spandre |
| 2005/0196940 A1 | 9/2005 | Yajima et al. |
| 2006/0001130 A1 | 1/2006 | Islam et al. |
| 2006/0030078 A1 | 2/2006 | Jiang et al. |
| 2006/0118515 A1 | 6/2006 | Dolechek et al. |
| 2006/0154401 A1 | 7/2006 | Gardner et al. |
| 2006/0244096 A1 | 11/2006 | Sekiya |
| 2006/0278956 A1 | 12/2006 | Cadouri |
| 2007/0087524 A1 | 4/2007 | Montgomery |
| 2007/0111476 A1* | 5/2007 | Sugiura .................. B23K 26/16 438/460 |
| 2007/0132034 A1 | 6/2007 | Curello et al. |
| 2007/0148807 A1 | 6/2007 | Akram |
| 2007/0249178 A1 | 10/2007 | Ogihara |
| 2007/0264832 A1 | 11/2007 | Arita et al. |
| 2008/0099900 A1 | 5/2008 | Oganesian et al. |
| 2009/0001609 A1 | 1/2009 | Lim |
| 2009/0057838 A1 | 3/2009 | Arita et al. |
| 2009/0061595 A1 | 3/2009 | Weber et al. |
| 2009/0065904 A1 | 3/2009 | Wang |
| 2009/0209087 A1 | 8/2009 | Arita |
| 2009/0263927 A1 | 10/2009 | Lin et al. |
| 2010/0048001 A1 | 2/2010 | Harikai et al. |
| 2010/0055875 A1 | 3/2010 | Haji et al. |
| 2010/0120227 A1 | 5/2010 | Grivna et al. |
| 2010/0173474 A1 | 7/2010 | Arita et al. |
| 2010/0197115 A1 | 8/2010 | Arita et al. |
| 2011/0175209 A1 | 7/2011 | Seddon et al. |
| 2011/0175225 A1 | 7/2011 | Seddon et al. |
| 2011/0177675 A1 | 7/2011 | Grivna et al. |
| 2011/0244657 A1 | 10/2011 | Grivna et al. |
| 2012/0244681 A1 | 9/2012 | Grivna et al. |
| 2014/0127885 A1* | 5/2014 | Grivna .................... H01L 21/78 438/464 |

FOREIGN PATENT DOCUMENTS

| | | |
|---|---|---|
| WO | 2004066382 A1 | 8/2004 |
| WO | 2007007883 A1 | 1/2007 |
| WO | PCT/JP2007/066960 | 8/2007 |
| WO | 2008081968 A1 | 7/2008 |
| WO | 2009063620 A1 | 5/2009 |

\* cited by examiner

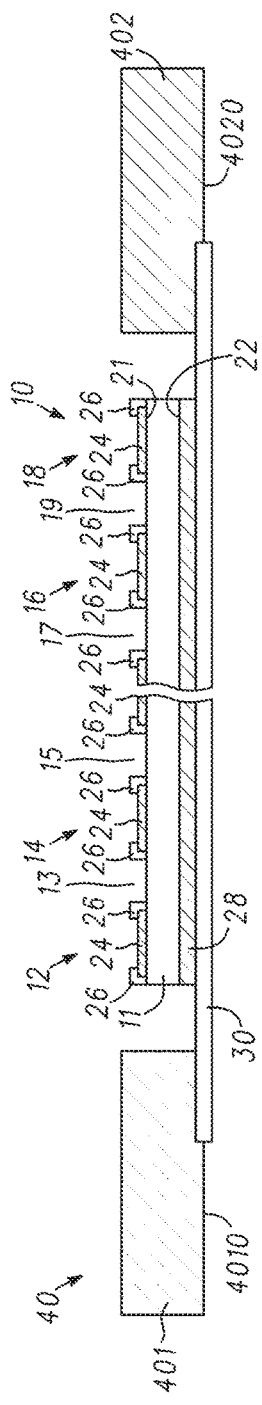
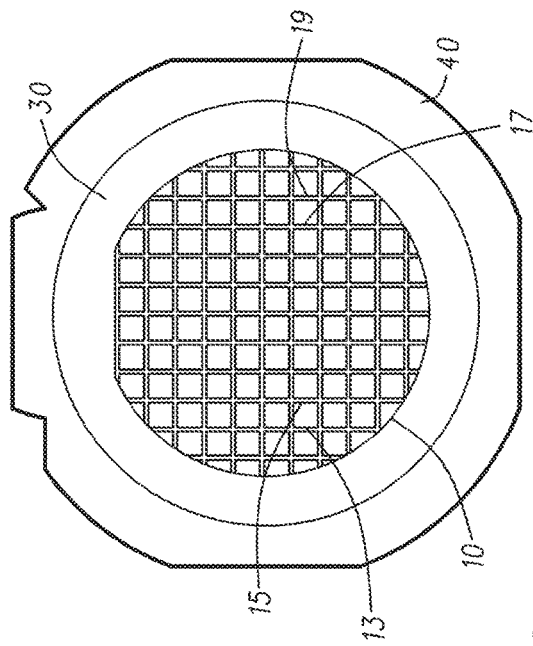
FIG. 2
FIG. 3

US 10,366,923 B2

METHOD OF SEPARATING ELECTRONIC DEVICES HAVING A BACK LAYER AND APPARATUS

CROSS REFERENCE TO RELATED APPLICATION

This application claims priority from U.S. Provisional Patent Application No. 62/344,725 filed on Jun. 2, 2016, which is hereby incorporated by reference in its entirety.

BACKGROUND

The present invention relates, in general, to electronics and, more particularly, to structures and methods for forming electronic devices such as semiconductor dies.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), laser ablation dicing, and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as back metal layers, because the etch process has been unable to effectively remove or separate the backside layers from the singulation lines. Removing or separating the backside layers from the scribe lines is necessary to facilitate subsequent processing, such as pick-and-place and assembly processes.

Accordingly, it is desirable to have an apparatus and method of singulating die from a wafer that removes, breaks, or separates the backside layers from within the singulation lines. It would be beneficial for the method to be cost effective and to minimize any damage to or contamination of the separated die.

BRIEF DESCRIPTION OF THE DRAWINGS

FIG. 2 illustrates a cross-sectional view of the wafer of FIG. 1 mounted to a carrier substrate in accordance with an embodiment of the present invention;

FIG. 3 illustrates a top view of the embodiment of FIG. 2;

Figure 1:
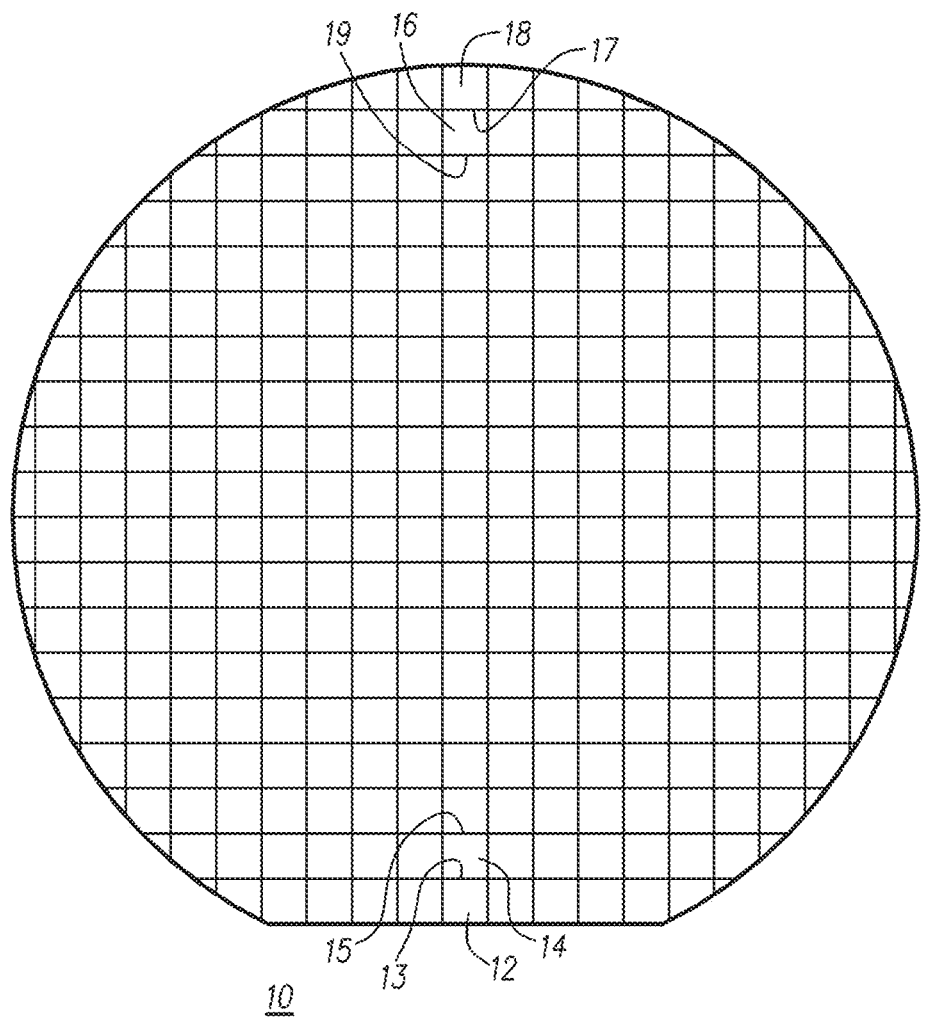
FIG. 1 illustrates a reduced plan view of an embodiment of a wafer in accordance with the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

FIG. 1 is a reduced plan view that graphically illustrates a wafer 10 at a later step in fabrication. In one embodiment, wafer 10 can be a semiconductor wafer 10 or a semiconductor substrate 10. Wafer 10 includes a plurality of semiconductor die or electronic die, such as die 12, 14, 16, and 18, that are formed on or as part of wafer 10. Die 12, 14, 16 and 18 are spaced apart from each other on wafer 10 by spaces in which singulation lines are to be formed or defined, such as scribe lines or singulation lines 13, 15, 17, and 19. As is well known in the art, all of the die on wafer 10 generally are separated from each other on all sides by areas or spaces where scribe lines or singulation lines, such as singulation lines 13, 15, 17, and 19 are to be formed. Die 12, 14, 16, and 18 can be any kind of electronic device including semiconductor devices such as, diodes, transistors, discrete devices, integrated circuits, sensor devices, optical devices, or other devices known to those skilled in the art. In one embodiment, wafer 10 has completed wafer processing including the formation of a backside layer or formation of a layer of material deposed on a second major surface of wafer 10, as will be described later.

FIG. 2 illustrates an enlarged cross-sectional view of wafer 10 at an early step in a die singulation method in accordance with an embodiment. In one embodiment, wafer 10 is attached to a carrier substrate 30, transfer tape 30, or carrier tape 30 that facilitates supporting the plurality of die on wafer 10 after the die are singulated. Such carrier tapes are well known to those skilled in the art. In one embodiment, carrier tape 30 can be attached to a frame 40, which can include frame portions or portions 401 and 402. In one embodiment, frame 40 is made of a rigid material, such as stainless steel. As illustrated, carrier tape 30 can be attached to surface 4010 of frame portion 401 and to surface 4020 of frame portion 402 using, for example, the adhesive side of carrier tape 30.

In the cross-section illustrated, wafer 10 can include a bulk substrate 11, such as a silicon substrate, which can include opposing major surfaces 21 and 22. In other embodiments, bulk substrate 11 can comprise other semiconductor materials such as heterojunction semiconductor materials or substrate 11 can be an insulating material such as ceramic materials or other dielectric materials, such as semiconductor on insulator (SOI) materials. In one embodiment, contact pads 24 can be formed along, in, on, or above portions of major surface 21 to provide for electrical contact between structures formed within substrate 11 and next levels of assembly or external elements. For example, contact pads 24 can be formed to receive bonding wires or clips that subsequently may be attached to contact pads 24, or contact pads 24 can be formed to receive a solder ball, bump or other type of attachment structure. Contact pads 24 generally can be a metal or other conductive material. Typically, a dielectric material 26 such as, a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, polyimide, or similar materials when substrate 11 is silicon. It should also be noted that a separate polymer protective layer, such as a patterned protective layer, can be used to protect the areas not intended to be etched during subsequent processing. In one embodiment, the patterned protective layer can be a patterned photoresist layer. An example of such a protective layer is noted as element 35 in FIG. 4 described later.

In one embodiment, openings can be formed in dielectric material 26 (and other dielectric layers that can be formed above or below dielectric material 26) to expose underlying surfaces of contact pads 24 and surfaces of substrate 11 where singulation lines 13, 15, 17, and 19 are to be formed. In one embodiment, the patterned photoresist layer described previously can be used to form the openings with an etch process. In other embodiments, the openings can be made by a number other means, such as laser ablation, laser ablation through a protective coating, or a sawing process. As illustrated in FIG. 2 and in accordance with the present embodiment, wafer 10 further includes a layer of material 28 or back layer 28 formed atop, on, or overlying major surface 22 of wafer 10. In one embodiment, layer 28 can be a conductive back metal layer. In another embodiment, layer 28 can be a conductive or a non-conductive adhesive(s). Layer 28 can be any suitable conductive material appropriate for electronic technology. In one embodiment, layer 28 can be a multi-layer metal system such as, titanium/nickel/silver, titanium/nickel/silver/tungsten, chrome/nickel/gold, copper, copper alloys, gold, or other materials known to those skilled in the art. In some embodiments, layer 28 is greater than about one micron in thickness. In other embodiments, layer 28 is greater than about two microns in thickness. In still other embodiments, layer 28 is greater than about three microns in thickness. In another embodiment, layer 28 can be a wafer backside coating (WBC) film or die-attach coating or film (DAF). In one embodiment, layer 28 can be formed having or provided with recesses, gaps, spaces, or channels between at least some adjacent die. In a further embodiment, the gaps are substantially aligned with corresponding spaces on the opposite side of wafer 10 where singulation lines 13, 15, 17, and 19 will be formed. In another embodiment, layer 28 is separated from the edges of at least some of the die.

FIG. 3 illustrates a top view of wafer 10 in accordance with the cross-sectional view of FIG. 2 after wafer 10 has been mounted on carrier tape 30 with layer 28 against carrier tape 30. In one embodiment, carrier tape 30 is mounted to frame 40 as illustrated in FIG. 3. As illustrated in FIG. 3, frame 40 can be configured with alignment portions or notches to better assist placing frame 40 into processing equipment such as the equipment described hereinafter.

Figure 4:
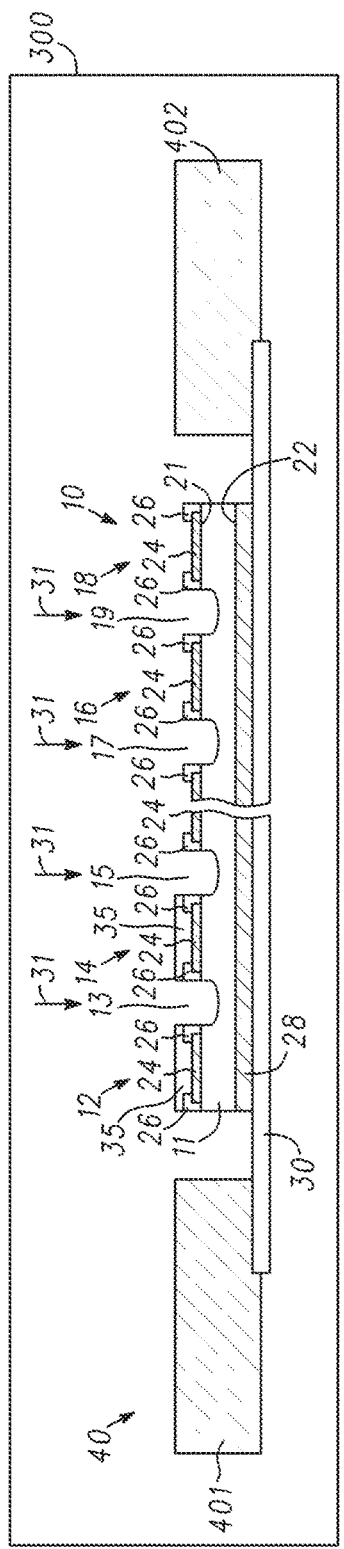
FIGS. 4-5 illustrate partial cross-sectional views of the wafer of FIG. 1 at various stages in a process of singulating die from the wafer in accordance with an embodiment of the present invention.
Figure 5:
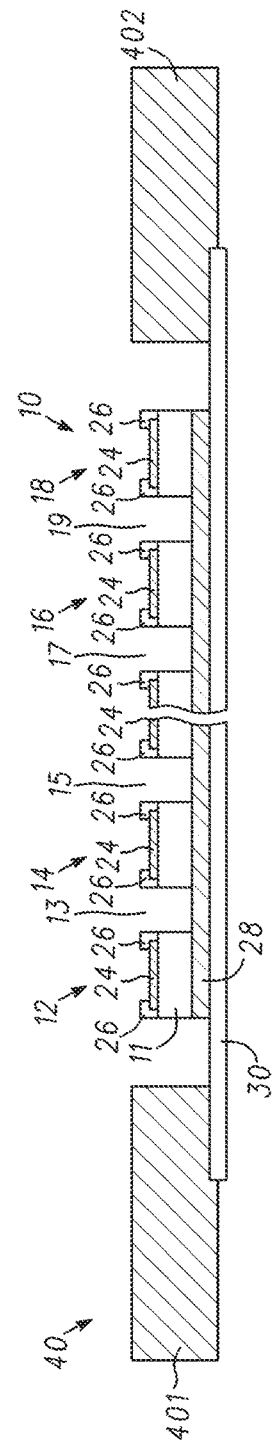

FIG. 4 illustrates an enlarged cross-sectional view of wafer 10 at a subsequent step during a singulation process in accordance with an embodiment. In FIG. 4, a plasma or dry etch singulation process is illustrated. It is understood that other singulation processes can be used. In one embodiment, wafer 10 mounted on carrier tape or film 30 is then placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in a deep reactive ion etch system. In one embodiment, the width of singulation lines 13, 15, 17, and 19 can be from about five microns to about twenty microns. Such a width is sufficient to ensure that the openings that form singulation lines 13, 15, 17, and 19 can be formed completely through substrate 11 stopping proximate to, adjacent to, atop of, adjoining, or on layer 28 because of the etch selectivity as generally illustrated in FIG. 5. In one embodiment, layer 28 can be used as a stop layer for the plasma etch singulation process. In one embodiment, singulation lines 13, 15, 17, and 19 can be formed in about five to about thirty minutes using the Bosch process. A suitable etch apparatus is available from Plasma-Therm of St. Petersburg, Fla., U.S.A.

Figure 6:
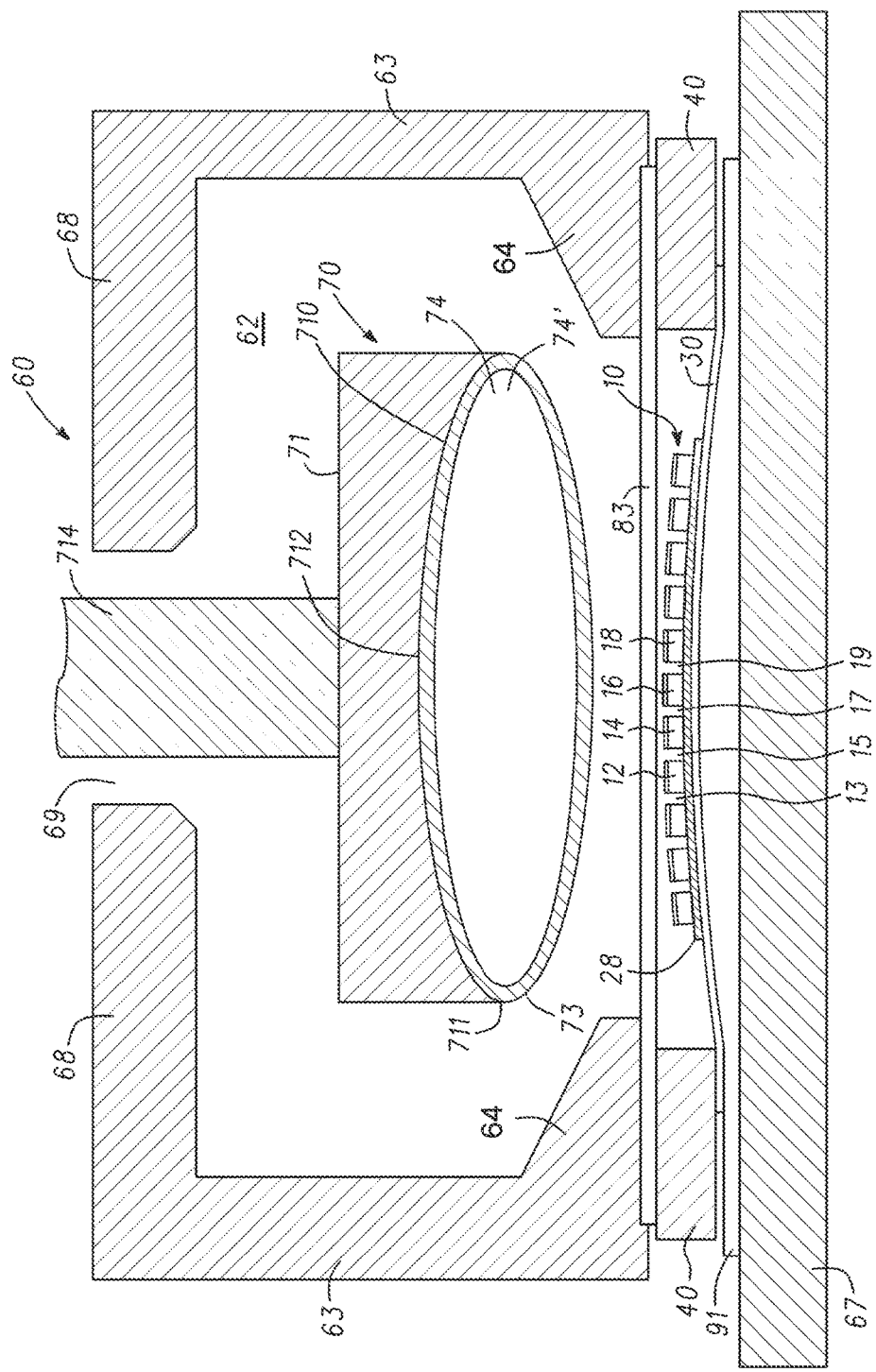
FIG. 6 illustrates a cross-sectional view of the wafer of FIG. 1 at a subsequent stage of singulation in accordance with an embodiment of the present invention.

FIG. 6 illustrates a cross-sectional view of a back layer separation apparatus 60 or separation apparatus 60 in accordance with a first embodiment, which can be configured to hold wafer 10 including frame 40 with carrier tape 30. In accordance with the present embodiment, apparatus 60 is configured as a whole wafer compression or back layer separation tool or system. In one embodiment, separation apparatus 60 can be configured to process a single wafer and to provide a back layer separation process where layer 28 on wafer 10 can be separated substantially at the same time (that is, batch separated) compared to other processes that separate only a localized portion of layer 28 at a time. In other embodiments, separation apparatus 60 can be configured to process multiple wafers each in a batch configuration.

Apparatus 60 can include a chamber 62 sized to accommodate wafer 10 and frame 40 in accordance with any various sizes of such structures. For example, chamber 62 can be configured to accommodate various wafer diameters including 100 millimeter (mm), 150 mm, 200 mm, 300 mm, 450 mm, etc. In one embodiment, chamber 62 is bounded on all sides by generally vertical sidewalls 63 that extend generally upward from a lower chamber lip or surface 64. Chamber 62 further includes an upper chamber wall or surfaces 68, which can include an opening 69 to accommodate a compression structure 70, which in the present embodiment comprises a compression plate 71 or pressure plate 71 and a pressure transfer vessel 73. In an alternative embodiment, opening 69 can be used to provide an entrance for a pressurized fluid configured to provide pressure to one or more of pressure plate 71, pressure transfer vessel 73, or directly to protective film 83 (described further below). In one embodiment, a shaft 714 is engaged with or attached to compression plate 71, and, as will be explained in additional detail with FIG. 7, shaft 714 can be engaged as part of a screw press or hydraulic press mechanism configured for moving compression plate 71 towards wafer 10. Chamber 62 can be any suitable shape appropriate for processing wafer 10 and frame 40 as well as other holding structures. In most embodiments, chamber 62 comprises a rigid material, such as metals, composite materials, or other suitable materials as known to those skilled in the art. In one preferred embodiment, chamber 62 comprises stainless steel.

In accordance with the present embodiment, apparatus 60 further includes a support structure 67 disposed below wafer 10 or on a side opposite to compression plate 71. Support structure 67 is configured to provide support for a substrate structure 91 interposed between support structure 67 and wafer 10. In accordance with the present embodiment, substrate structure 91 does not have a uniform profile in cross-sectional view. In one embodiment, substrate structure 91 has a curved or dome-like profile in cross-sectional view where the curved profile has a concave shape disposed on the surface facing wafer 10 such that the curved profile is thicker in the central portion of substrate structure 91 as generally illustrated in FIG. 6. The profile preferably tapers to a reduced thickness towards the outer perimeter of wafer 10. The profile or curvature can be modified depending on the size of die 12, 14, 16, and 18. In one embodiment, the extent of curvature can be increased as die size is decreased. In another embodiment, the curvature of substrate structure 91 can be adjustable or variable and the curvature of the structure formed after pressure is applied from compression plate 71.

In one embodiment, compression plate 71 is movably associated or attached within chamber 62 and adapted to apply a controlled pressure to wafer 10 through pressure transfer vessel 73, which contains a material 74, such as a fluid 74. In one embodiment, vessel 73 can be a fluid filled vessel, such as a fluid filled bladder that is oriented between wafer 10 and compression plate 71. In one embodiment, vessel 73 comprises a cross-linked polymer material that exhibits high elastic deformation, such as a rubber or other materials or gases as known to those skilled in the art to provide substantially uniform pressure across wafer 10. In one embodiment, vessel 73 is a pressure balloon. In a further embodiment, vessel 73 can be a fluid filled tube that expands to cover wafer 10 when compression plate 71 compresses vessel 73 against wafer 10.

In accordance with the present embodiment, compression plate 71 is configured with a convex shaped leading surface 710, curved surface 710, or inward curved surface 710, which faces vessel 73. In one embodiment, the outer rim portion 711 of compression plate 71 is thicker than a central portion 712 of compression plate 71 as generally illustrated in the cross-sectional view of FIG. 6 such that force is exerted against wafer 10 in a predetermined manner. In accordance with one embodiment, in the configuration illustrated, the separation or breakage of layer 28 is initiated in a central portion of wafer 10 and then progresses outward towards the perimeter edges of wafer 10 as force is applied to compression plate 71, vessel 73 and wafer 10. In most embodiments, compression plate 71 comprises a rigid material, such as a metal, a composite material, or other materials as known to those skilled in the art. In one embodiment, compression plate 71 comprises stainless steel.

In some embodiments, a protective film 83 or protective pad 83 is placed between wafer 10 and vessel 73 to protect and/or cushion wafer 10 during the separation of layer 28. In one embodiment, protective film 83 is a non-adhesive film or a low adhesive film where the adhesive strength is selected so as to minimize the occurrence of individual die being removed from carrier tape 30 after the separation of layer 28 has occurred. In other embodiments, protective film 83 can have a high adhesive strength (that is, higher than the adhesive strength of carrier tape 30) if it is desired to have the separated die adhere to protective film 83, for example, for additional processing to the back side of wafer 10. In another embodiment, protective film 83 comprises a polyester sheet material. Protective film 83 can a single layer or multiple layers configured to protect wafer 10 and to assist in providing the substantially uniform pressure transfer to wafer 10. In accordance with the present embodiment, chamber 62 is configured to clamp in place atop frame 40 and substrate structure 91 to hold the various components stationary.

In accordance with the present embodiment, material 74 can be a fluid 74, such as one or more liquids, one or more gases, combinations thereof, or other materials that can flow and/or that are capable of transferring pressure applied to vessel 73 to wafer 10. In one embodiment, fluid 74 within vessel 73 can include water. In one embodiment, fluid 74 can be water that is anaerobic (that is, water having low dissolved oxygen content or that has been deoxygenated). In other embodiments, fluid 74 can be a fluid having a higher viscosity than water. In some embodiments, fluid 74 can be liquid-crystalline material. In still other embodiments, vessel 73 can be filled with a solid material 74', such as synthetic microspheres, carbon nanotubes, graphene, or other solid or solid-like materials that can impart or transfer pressure from compression plate 71 to protective substrate 83 and wafer 10 without damaging wafer 10. In some embodiments, vessel 73 can be filled with a gas, such as air, nitrogen, and/or argon. In accordance with the present embodiment and illustrated in FIG. 6, vessel 73 has a horizontal width at least proximate to or adjacent to wafer 10 that is larger than the horizontal width or diameter of wafer 10 to facilitate batch singulation or separation of layer 28 in scribe lines 13, 15, 17, and 19 of wafer 10. That is, vessel 73 is configured or adapted to apply a pressure along or across all of layer 28 and wafer 10 to provide batch separation or breakage of layer 28 in the scribe lines.

It is understood that apparatus 60 may include other sealing devices, load/unload systems, and measurement and control systems that are not illustrated in FIG. 6 for the ease of understanding embodiments of the present invention. Also, it is understood that in an alternative embodiment, a gate valve can be inserted into opening 69 and a high pressure fluid can be used to push protective film 83 against layer 28 to facilitate the separation of layer 28 in the scribe lines, including scribe lines 13, 15, 17, and 19.

Figure 7:
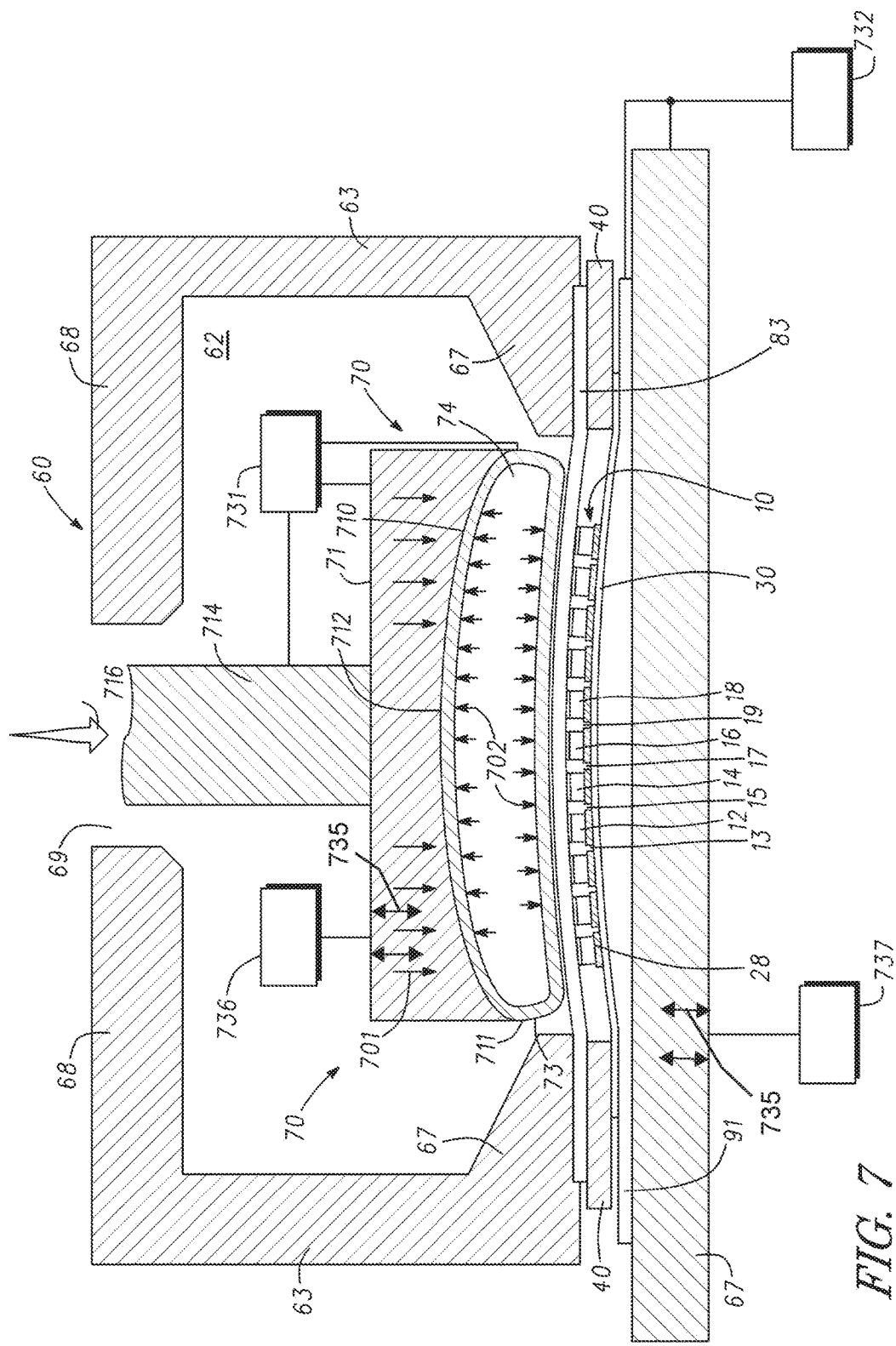
FIG. 7 illustrates a cross-sectional view of the wafer of FIG. 1 after further processing in accordance with the embodiment of FIG. 6.

FIG. 7 illustrates a cross-sectional view of apparatus 60 with compression plate 71 and vessel 73 pushed up against protective film 83 and wafer 10. In one embodiment, a screw press mechanism can be engaged with shaft 714 and compression plate 71 for moving vessel 73 into contact with protective film 83 and wafer 10 in a controlled manner to break, singulate, or separate layer 28 within the scribe lines including scribe lines 13, 15, 17, and 19. In some embodiments, a controlled downward pressure (represented by arrows 701 and 702) is applied through compression plate 71 using, for example, a stepper motor driving a threaded shaft attached to compression plate 71. In another embodiment, a fluid (generally represented by arrow 716) can be used to apply a pressure to vessel 73 through a port in shaft 714. By way of example, fluid 716 can be a gas or a liquid. In other embodiments, compression plate 71 can be adjusted using hydraulic or pneumatic techniques. In some embodiments, compression plate 71 can be operated manually. In some embodiments, compression plate 71 is pressed against vessel 73 at a pressure in a range from about 5000 pounds per square inch (PSI) through about 20,000 PSI (about 34,000 Kilopascal (kPa) through about 138,000 kPa), which is transferred to wafer 10 through vessel 73 to separate or break layer 28 in the singulation lines.

In one preferred embodiment, compression plate 71 and vessel 73 push against protective substrate 83 and wafer 10 in a first orientation in a first separation step to separate or break layer 28 in a first direction. Next, compression plate 71 and vessel 73 can be retracted away from protective substrate 83 and wafer 10 and one or more of compression plate 71 and wafer 10 can be rotated with respect to each other, for example, approximately 90 degrees, and then again pushed against protective substrate 83 and wafer 10 in a second orientation to further separate or break layer 28 in a second direction as part of a second separation step. In other embodiments, additional separation steps can be used with additional rotations of compression plate 71 and wafer 10. These additional steps can be a function of, for example, die size and thickness of layer 28.

Apparatus 60 is further illustrated in FIG. 7 to include temperature variation systems 731 and 732. In one embodiment, temperature variation system 731 can be engaged with one or more of compression plate 71 and vessel 73 and configured to vary the temperature of fluid 74, which can be transferred to protective substrate 83 and wafer 10. In some embodiments, fluid 74 can be heated above room temperature. In some embodiments, fluid 74 can be heated to a temperature in a range from about 35 degrees Celsius to about 65 degrees Celsius. In one embodiment, fluid 74 can be heated to a temperature in a range from about 45 degrees Celsius to about 55 degrees Celsius. In another embodiment, fluid 74 can be cooled to a temperature less than about 25 degrees Celsius. In a further embodiment, fluid 74 can be cooled to a temperature less than or equal to about 15 degrees Celsius. In another embodiment, fluid 716 can be heated and/or cooled, and in this way can be used to heat and/or cool fluid 74 and protective substrate 83 and wafer 10.

In one embodiment, temperature variation system 732 can be engaged with one or more of support structure 67 and substrate structure 91 and configured to vary the temperatures of these structures, which can be transferred to vary the temperature of carrier tape 30 and wafer 10. Similar temperature ranges can be used for heating or cooling support structure 67 and/or substrate structure 91. In some embodiments, both temperature variation systems 731 and 732 can be used and both systems can be set at the same temperature range or can be set at different temperature ranges. Non-limiting examples of temperature variation systems include resistive heating structures, lamp heating structures, liquid or air cooled apparatus, liquid nitrogen, or other heating and cooling techniques as known to those skilled in the art.

In accordance with the present embodiment, apparatus 60 is further illustrated in FIG. 7 to include one or more transducer systems 736 and 737. In one embodiment, transducer system 736 can be engaged with, for example, compression plate 71, and transducer system 737 can be engaged with support structure 67. In accordance with the present embodiment, transducer systems 736 and 737 are configured to provide a cyclic load, pressure waves, or shear waves (represented in part by arrows 735) to layer 28 thereby fatiguing those portions of layer 28 disposed in the singulation lines of wafer 10 including, for example, singulation lines 13, 15, 17, and 19. Stated another way, transducer systems 736 and 737 can be configured to apply high frequency mechanical vibrations to layer 28 such that those portions of layer 28 in the singulation lines break or detach from other parts of back layer 28 adjoining the die, including die 12, 14, 16, and 18, due to rapid fatigue failure or fracture.

That is, transducer systems 736 and 737 are configured to apply and remove a nominal load (i.e., applying a plurality of load-unload cycles) to and from back layer 28 thereby fatiguing and breaking back layer 28 within the singulation lines of wafer 10, including singulation lines 13, 15, 17, and 19.

In some embodiments, transducer systems 736 and 737 can be configured to produce vibrations having one or more frequencies in a range from about 1,000 Hertz (Hz) to about 100,000 Hz, and an amplitude in a range from about 0.00254 millimeter (mm) to about 2.54 mm, so as to develop extremely high peak accelerations, for example, of the order of at least 9,806 meters/square second. In one embodiment, transducer systems 736 and 737 can configured to produce vibrations having one more frequencies in a range from about 10,000 Hz to about 30,000 Hz. Transducer systems 736 and 737 can include electromechanical or solid state transducers, such as piezoelectric and magnetostrictive devices.

Figure 8:
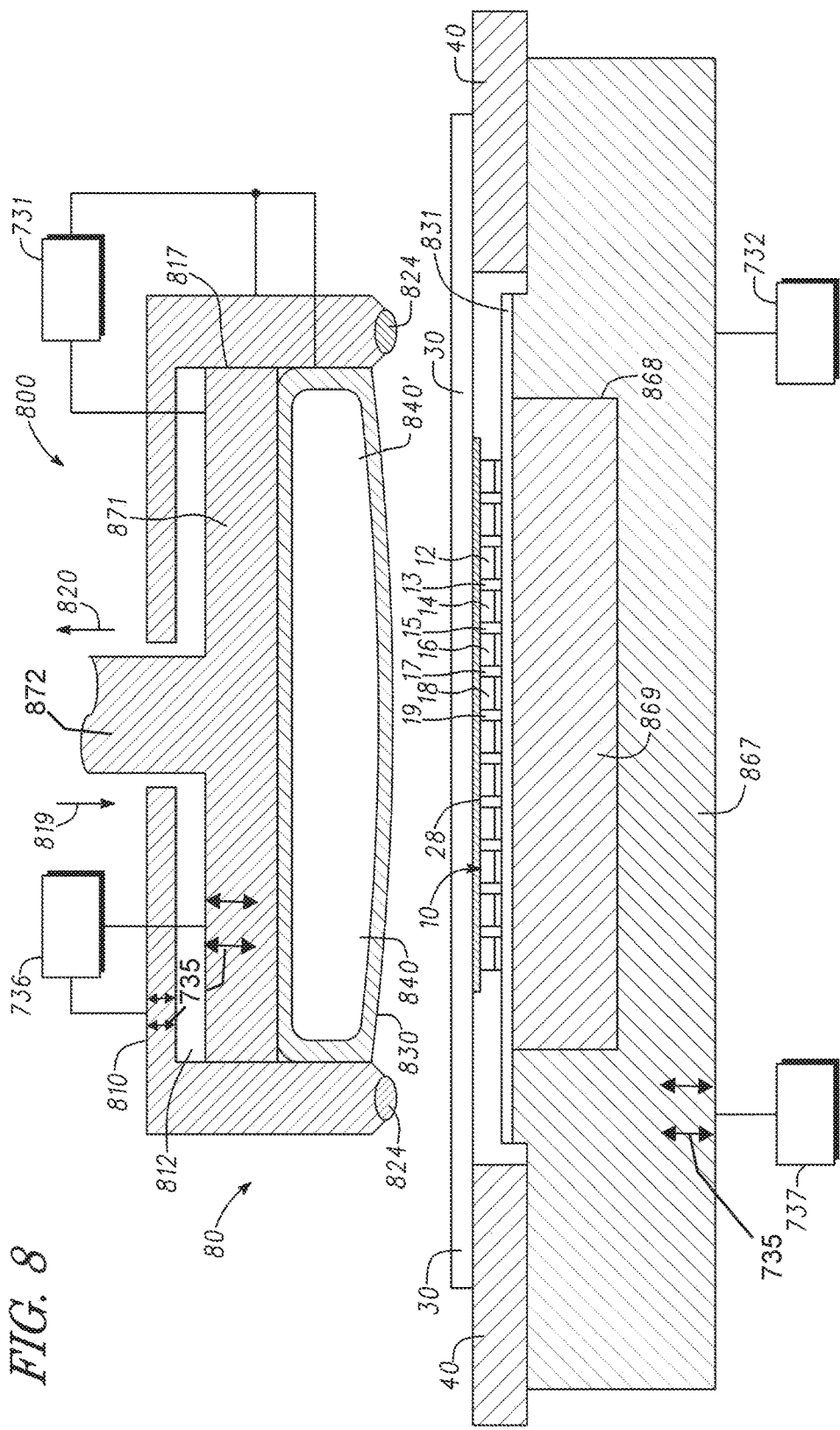
FIG. 8 illustrates a cross-sectional view of the wafer of FIG. 1 at a subsequent stage of singulation in accordance with another embodiment of the present invention.

FIG. 8 illustrates a cross-sectional view of a back layer separation apparatus 80 in accordance with another embodiment, which can be configured to hold wafer 10 including frame 40 with carrier tape 30. In accordance with the present embodiment, apparatus 80 is configured as a whole wafer compression or back layer separation tool or system. In one embodiment, apparatus 80 includes a compression structure 800, which can include a containment structure 810 having a chamber portion 812. In one embodiment, compression structure 800 further includes a compression plate 871 or pressure plate 871 disposed within chamber portion 812, which can be moveably engaged with (generally denoted with arrows 819 and 820) containment structure 810 to provide downward pressure to a material filled vessel 830, fluid filled vessel 830, or a pressure transfer vessel 830. In one embodiment, compression structure 800 includes a shaft 872 that can be mechanically engaged with compression plate 871 to move compression plate 871 towards wafer 10 to create a downward or vertical pressure that is transferred by vessel 830 to carrier tape 30 and wafer 10. This applied downward pressure separates or breaks layer 28 disposed within the singulation lines of wafer 10, including, for example, singulation lines 13, 15, 17, and 19. In some embodiments, a hydraulic press is used to move compression plate 871. In other embodiments, a screw piston can be used. In most embodiments, containment structure 810 comprises a rigid material, such as metals, composite materials, or other suitable materials as known to those skilled in the art. In one preferred embodiment, containment structure 810 comprises stainless steel.

Vessel 830 can be configured similarly to vessel 73, and can be configured to hold a fluid (e.g., liquid(s) and/or gas(es)) 840 as described previously. In an alternative embodiment, vessel 830 can be filled with a solid material 840', such as synthetic microspheres, carbon nanotubes, graphene, other solid or solid-like materials, or similar materials as known to those skilled in the art that can substantially uniformly impart or transfer pressure from compression plate 871 to carrier tape 30 without damaging wafer 10. In one embodiment, vessel 830 has a diameter greater than the diameter of wafer 10.

In accordance with the present embodiment, a seal 824, such as an o-ring seal is attached to a surface of containment structure 810 facing wafer 10, which can be configured to provide additional sealing of vessel 830 when vessel 830 is pushed against carrier tape 30. Among other things, seal 824 advantageously functions to further contain vessel 830 within containment structure 810 when pressure is applied to vessel 830.

Apparatus 80 further includes a support structure 867, pedestal structure 867, or platform 867. In one embodiment, support structure 867 comprises a rigid material, such as a metal, a composite material, or other materials as known to those skilled in the art. In one embodiment, support structure 867 is provided with a centrally located recess 868 that preferably has a width or diameter greater than the diameter of wafer 10. In one embodiment, a material 869 is placed within recess 868 that compresses when downward pressure is applied to wafer 10. In one embodiment, material 869 comprises a porous ceramic material, a foam-like material, or similar materials as known to those skilled in the art. In some embodiments, a protective layer 831 is disposed on a surface of support structure 867 facing wafer 10, and is configured to protect the front or adjacent surface of wafer 10 during the separation process. In one embodiment, protective layer 831 can be a polyester film or similar materials as known to those skilled in the art. In one preferred embodiment, the outer perimeter of the upper portion of support structure 867 is recessed for engaging frame 40. During operation, containment structure 810 is lowered so that seals 824 are pressed against carrier tape 30 and protective layer 831 to provide a seal against support structure 867. In some embodiments, compression plate 871 is pressed against vessel 830 at a pressure in a range from about 5000 pounds per square inch (PSI) through about 20,000 PSI (about 34,000 Kilopascal (kPa) through about 138,000 kPa), which is transferred to wafer 10 through vessel 830 to separate or break layer 28 in the singulation lines. Stated another way, the pressure against vessel 830 is raised through compression plate 871, which can be driven, for example, by a screw piston.

Similar to apparatus 60, in some embodiments apparatus 80 is provided with one or more of temperature variations systems 731 and 732 and/or is provided with one or more of transducer systems 736 and 737 as described previously. In one embodiment, transducer system 736 can be engaged with one or more of containment structure 810 and compression plate 871 to provide a cyclic load, pressure waves, or shear waves (represented in part by arrows 735) to layer 28. In one embodiment, transducer system 737 can be engaged with support structure 867 to provide a cyclic load, pressure waves, or shear waves (represented in part by arrows 735) to layer 28. In one embodiment, temperature variation system 731 can be engaged with one or more of compression plate 871, containment structure 810, and vessel 830. In a further embodiment, temperature variation system 732 can be engaged with support structure 867.

Figure 9:
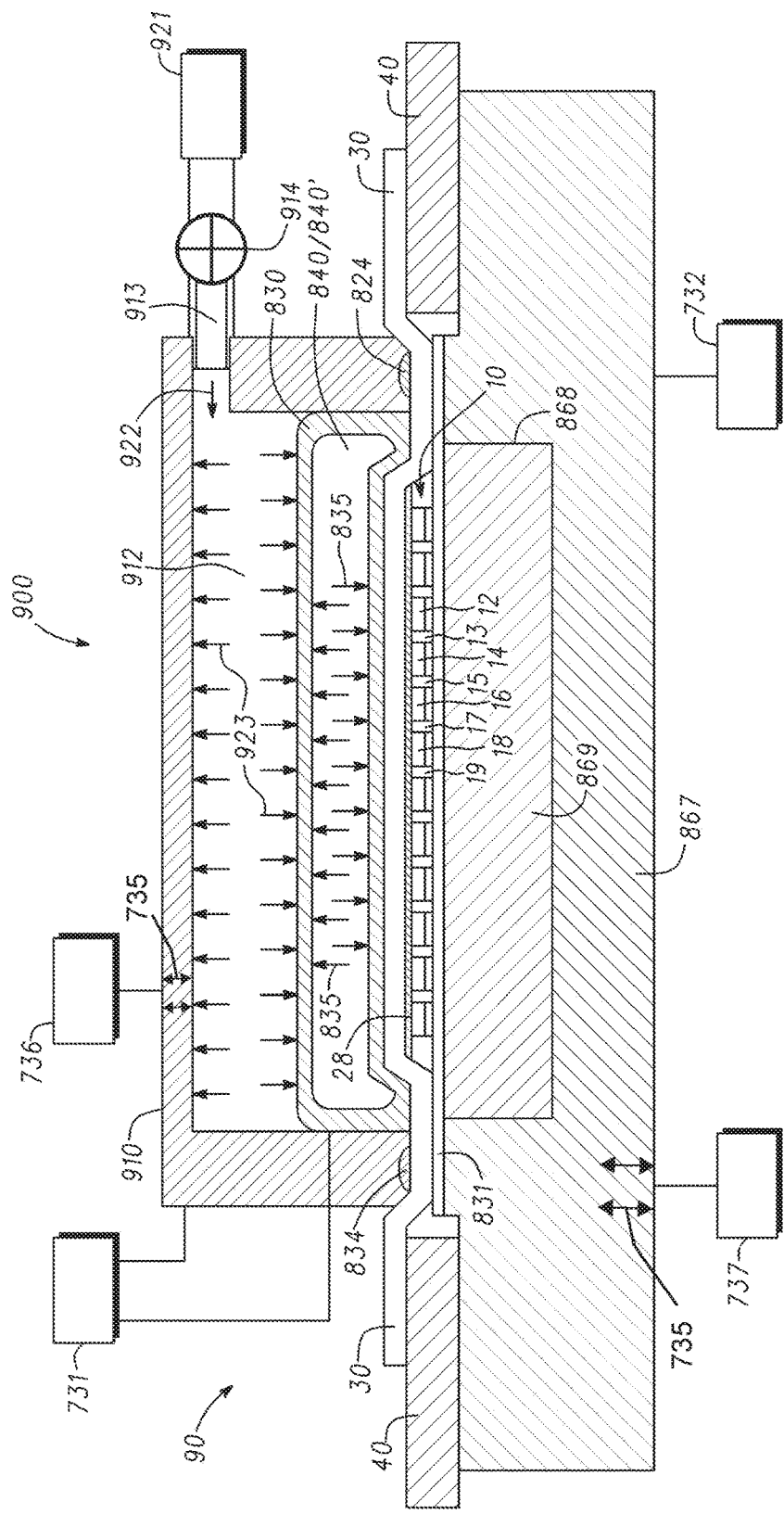
FIG. 9 illustrates a cross-sectional view of the wafer of FIG. 1 at a subsequent stage of singulation in accordance with a further embodiment of the present invention.

FIG. 9 illustrates a cross-sectional view of a back layer separation apparatus 90 in accordance with another embodiment, which can be configured to hold wafer 10 including frame 40 with carrier tape 30. In accordance with the present embodiment, apparatus 90 is configured as a whole wafer compression or back layer separation tool or system. Apparatus 90 is similar to apparatus 80 and only the differences will be described hereinafter. In one embodiment, apparatus 90 comprises a compression structure 900, which includes a containment structure 910 having a chamber portion 912 configured for receiving a pressurized fluid 922 through port or opening 913 disposed in a surface of containment structure 910 and applying a pressure to fluid filled vessel 830. In one preferred embodiment, fluid 922 is placed under high pressure before fluid 922 is introduced into chamber portion 912. In another embodiment, fluid 922 can be introduced directly into vessel 830. In most embodiments, containment structure 910 comprises a rigid material, such as metals, composite materials or other suitable materials as known to those skilled in the art. In one embodiment, containment structure 910 comprises a stainless steel.

In one embodiment, a high pressure regulator 914 is engaged with port 913 and is used to regulate the flow of a pressurized fluid source into chamber portion 912. In one embodiment, a high pressure gas source is engaged with high pressure regulator 914 and configured for providing a pressurized fluid 922, such as a source gas, between about 10,000 PSI and about 20,000 PSI. In one embodiment, nitrogen provided at a pressure of about 15,000 PSI is used. Although not illustrated, a vent device can be engaged with chamber 912 for venting the source gas after back layer 28 is separated.

In accordance with the present embodiment, a fluid delivery system 921 is provided and engaged with high pressure regulator 914. In one embodiment, fluid delivery system 921 comprises a high pressure gas cylinder capable of delivering pressurized fluid 922 at a pressure in range from about 10,000 PSI and about 20,000 PSI into chamber 912. Fluid 922 provides a pressure (generally represented by arrows 923) onto vessel 830 (generally represented by arrows 835). Vessel 830 transfers the applied pressure to carrier tape 30 and wafer 10 to separate or break back layer 28 in the singulation lines, including singulation lines 13, 15, 17, and 19, of wafer 10. In the present embodiment, containment structure 910 is illustrated as pushed against carrier substrate 30 and protective layer 830 such that seal 824 provides a tight seal to contain vessel 830 as pressure is applied by fluid 922.

Similar to apparatus 60, in some embodiments apparatus 90 is provided with one or more temperature variation systems 731 and 732, and/or is provided with one or more transducer systems 736 and 737 as described previously. In one embodiment, transducer system 736 can be engaged with containment structure 910 to provide a cyclic load, pressure waves, or shear waves (represented in part by arrows 735) to layer 28. In one embodiment, transducer system 737 can be engaged with support structure 867 to provide a cyclic load, pressure waves, or shear waves (represented in part by arrows 735) to layer 28. In one embodiment, temperature variation system 731 can be engaged with one or more of, containment structure 910 and vessel 830. In one embodiment, temperature variation system 732 can be engaged with support structure 867.

Figure 10:
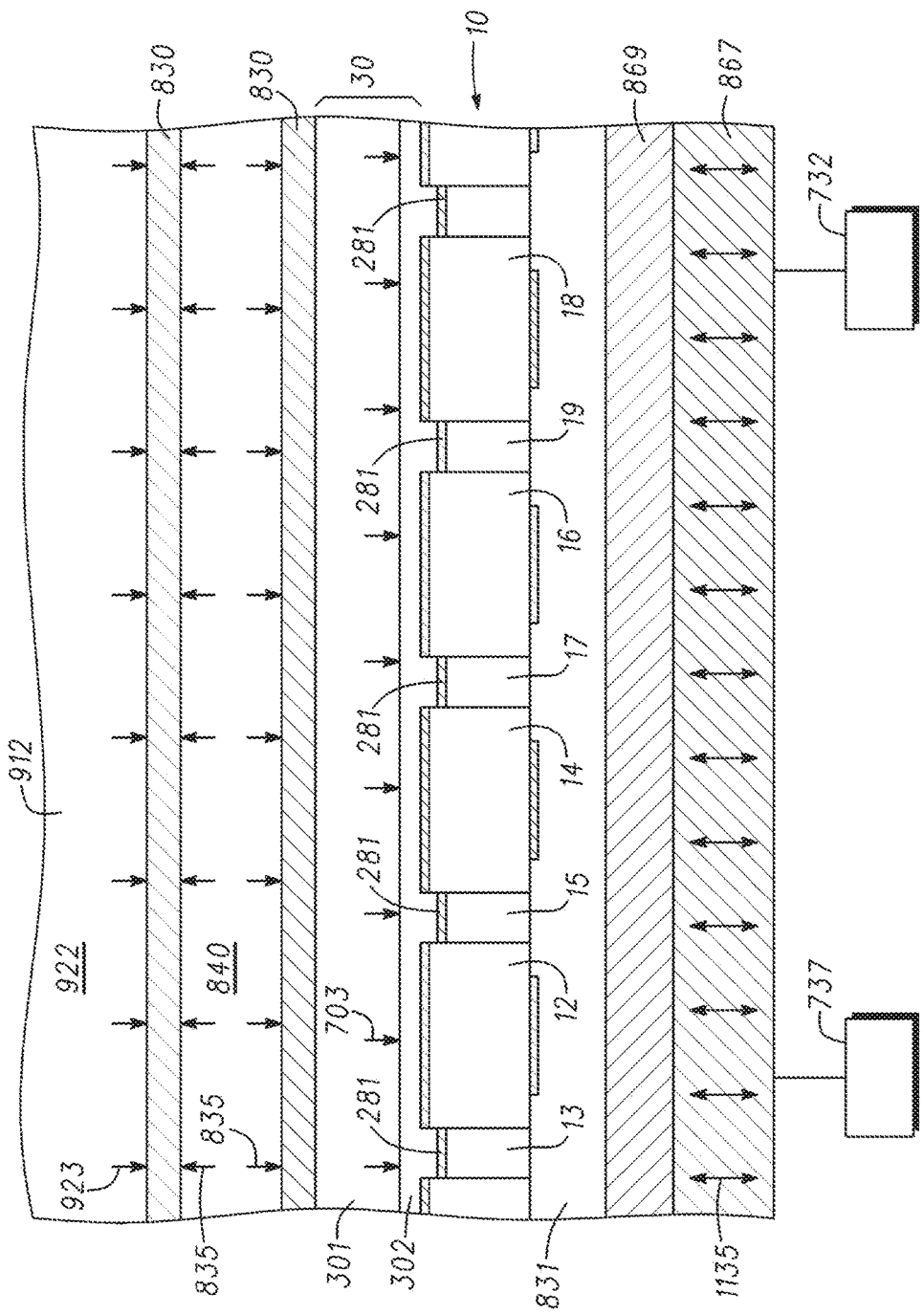
FIG. 10 illustrates a partial cross-sectional view of a portion of the embodiment illustrated in FIG. 9.

FIG. 10 illustrates an enlarged partial cross-sectional view of a portion of apparatus 90 and wafer 10 of FIG. 9. In FIG. 10, carrier tape 30 is enlarged to show both a singulation film portion 301 and an adhesive film portion 302 between singulation film portion 301 and layer 28 on wafer 10. In some embodiments, singulation film portion 301 can have a thickness from about 70 microns to about 90 microns and adhesive film portion 302 can have thickness from about 20microns to about 40 microns. In accordance with some embodiments, pressure applied from fluid 922 to vessel 830 having fluid 840 is transferred to carrier tape 30 as generally represented by arrows 923, 835, and 703. The downward force applied to carrier tape 30 extrudes adhesive film portion 302 in scribe lines 13, 15, 17, and 19 between die 12, 14, 16, and 18 to separate away, break, or singulate portions 281 of layer 28 in the scribe lines as generally illustrated in FIG. 10.

In a further embodiment, transducer systems 736 and 737 (only transducer system 737 is illustrated in FIG. 10) can be engaged with apparatus 90 to provide longitudinal and/or shear pressure waves (represented, for example, by arrows 1135) to assist in the separation or breakage of layer 28. In still further embodiments, temperature variations structures 731 and 732 (only temperature variation system 732 is illustrated in FIG. 10) can be engaged with apparatus 90 to provide temperature induced assistance in the separation of layer 28. In accordance with the present embodiments, transducer systems 736 and 737 and temperature variation systems 731 and 732 enable the use of less pressure applied to back layer 28 by pressure transfer vessel 830.

Figure 11:
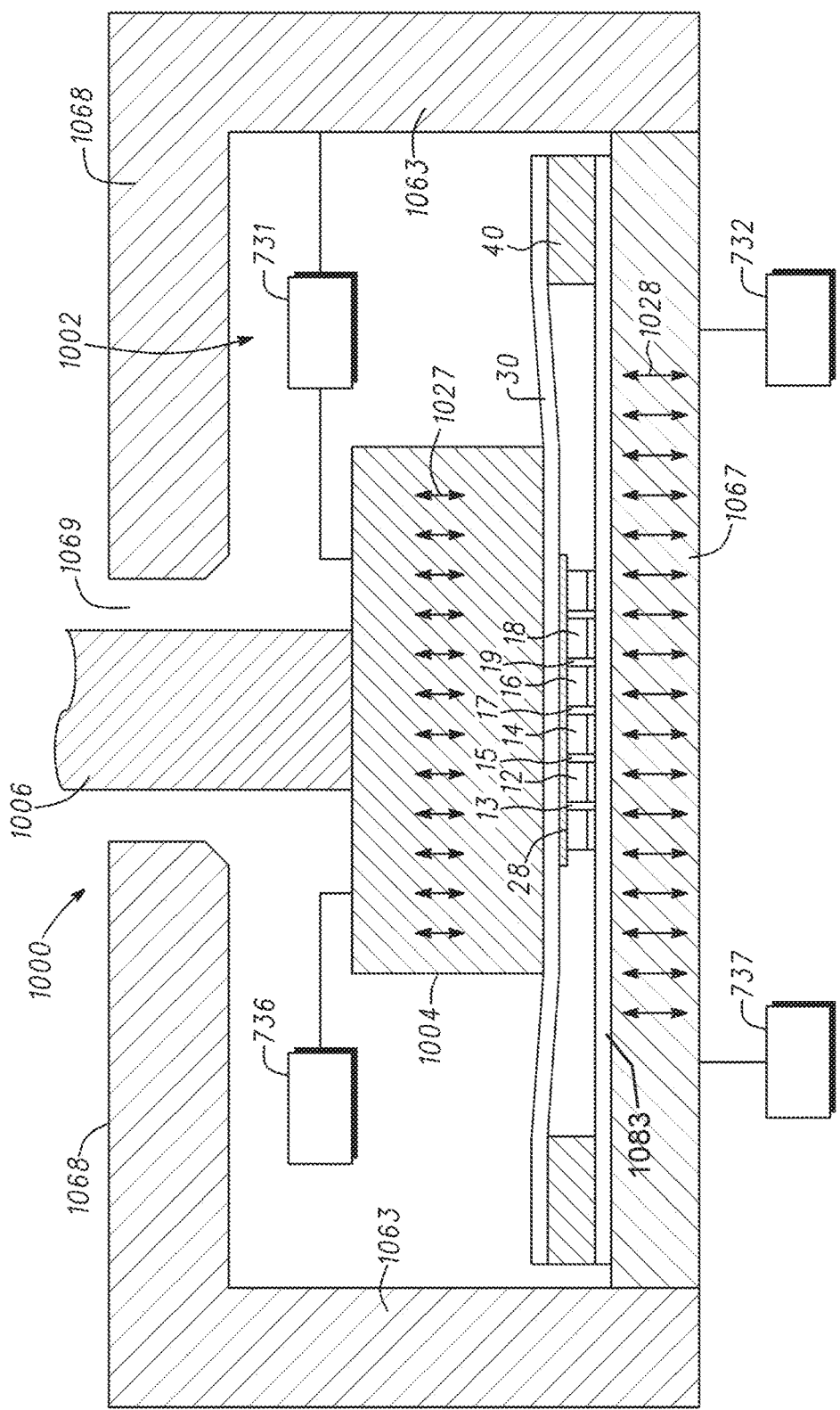
FIG. 11 illustrates a cross-sectional view of the wafer of FIG. 1 at a subsequent stage of singulation in accordance with another embodiment of the present invention.

Turning now to FIG. 11, another embodiment of a whole wafer compression or back layer separation apparatus 1000 is illustrated in cross-sectional view. In accordance with the present embodiment, apparatus 1000 is configured as a whole wafer compression or back layer separation tool or system. In accordance with the present embodiment, apparatus 1000 can be configured to hold wafer 10 including frame 40 and carrier tape 30. In one embodiment, separation apparatus 1000 can be configured to process a single wafer and to provide a back layer separation process where layer 28 on wafer 10 is separated substantially at the same time (that is, batch separated) compared to other processes that separate only a localized portion of layer 28 at a time. In other embodiments, separation apparatus 1000 can be configured to process multiple wafers each in a batch configuration.

Apparatus 1000 includes a chamber 1002 sized to accommodate wafer 10 and frame 40 and a compression structure 1004. In one embodiment, chamber 1002 is bounded by sidewall portions 1063 that extend generally upward from a support surface 1067. Chamber 1002 further includes upper chamber wall 1068, which is configured with an opening 1069 to accommodate compression structure 1004. In one embodiment, compression structure 1004 can be engaged with shaft 1006 configured to movably adjust or position compression structure 1004 with respect to wafer 10. In one embodiment, shaft 1006 can be engaged with a screw press, a hydraulic press, or other mechanical movement apparatus as known to those skilled in the art. Compression structure 1004 is movably associated with apparatus 1000 and adapted to apply a substantially uniform and controlled pressure to wafer 10. In one embodiment, a protective film 1083 is interposed between wafer 10 and support structure 1067. In one embodiment, protective film 1083 can be a carrier tape having the same or different adhesive characteristics compared to carrier tape 30.

In accordance with the present embodiment, apparatus 1000 is further provided with one or more of transducer system 736 and transducer system 737. In one embodiment, transducer system 736 is engaged with compression structure 1004 and configured to provide one or more of longitudinal and shear ultrasonics or pressure waves (generally represented by arrows 1027) to wafer 10. In one embodiment, transducer system 737 is engaged with support structure 1067 and configured to provide one or more of longitudinal and shear ultrasonics or pressure waves (generally represented by arrows 1028) to wafer 10. In one embodiment, when both transducer systems 736 and 737 are used, the transducer systems can be configured to provide additive or cancelling outputs with respect to each other. In accordance with the present embodiment, transducer systems 736 and/or 737 enable less pressure to be applied by compression structure 1004, and are configured to fatigue back layer 28 thereby breaking back layer 28 in the singulation lines of wafer 10, including singulation lines 13, 15, 17, and 19.

In one embodiment, temperature variation system 731 can be engaged with one or more of compression structure 1004 and chamber 1002 to heat or cool chamber 1002. In one embodiment, compression chamber 1004 and/or chamber 1002 can be heated to a temperature above room temperature. In one embodiment, compression structure 1004 and/or chamber 1002 can be heated to a temperature in a range from about 35 degrees Celsius to about 65 degrees Celsius. In one embodiment, compression structure 1004 and/or chamber 1002 can be heated to a temperature in a range from about 45 degrees Celsius to about 55 degrees Celsius. In another embodiment, compression structure 1004 and/or chamber 1002 can be cooled to a temperature less than about 25 degrees Celsius. In a further embodiment, compression structure 1004 and/or chamber 1002 can be cooled to a temperature less than or equal to about 15 degrees Celsius.

In a further embodiment, temperature variation system 732 can be engaged with support structure 1067 and configured to vary the temperature of support structure 1067, which can be transferred to vary temperate of protective film 1083 and wafer 10. Similar temperature ranges can be used for heating or cooling support structure 1067 as described previously. In some embodiments, both temperature variation systems 731 and 732 can be used and both systems can be set at the same temperature range or can be set at different temperature ranges.

Figure 12:
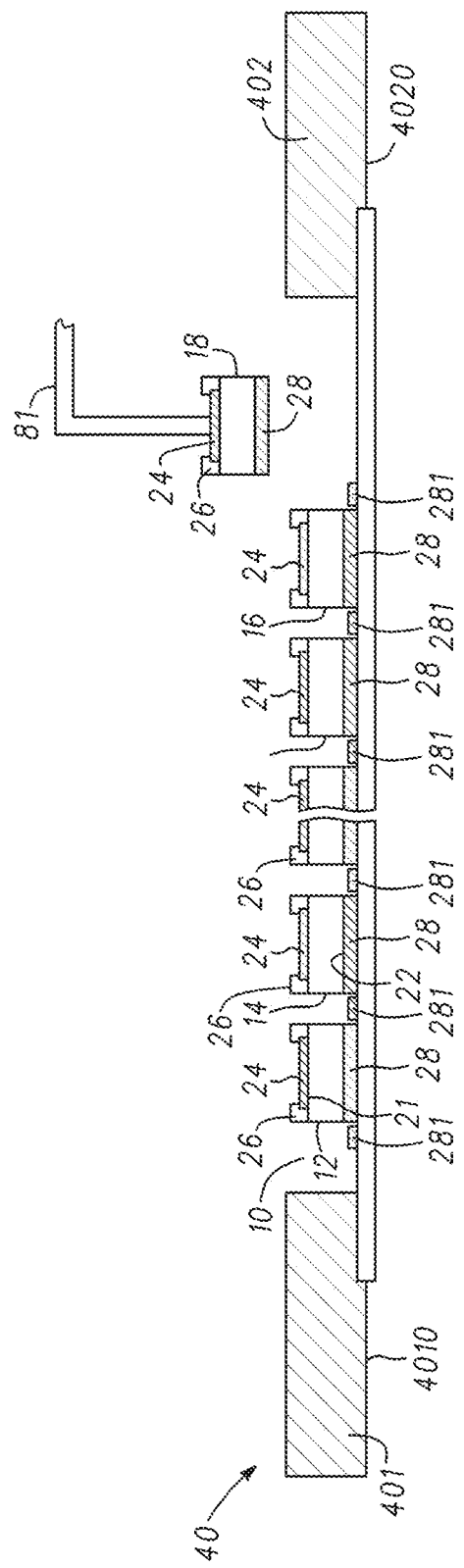
FIG. 12 illustrates the wafer of FIG. 1 after singulation and back layer separation at a further stage of manufacture in accordance with an embodiment of the present invention.

FIG. 12 illustrates a cross-sectional view of wafer 10 at a further stage of manufacturing. In one embodiment, die 12, 14, 16, and 18 can be removed from carrier tape 30 as part of a further assembly process using, for example, a pick-and-place apparatus 81 as generally illustrated in FIG. 12. As illustrated in FIG. 12 portions 281 separated from layer 28 remain on carrier tape 30. In one embodiment, die 12, 14, 16, and 18 can be attached to conductive lead frames or substrates, electrically connected to leads for traces, and encapsulated with a plastic molding compound. In one embodiment, carrier tape 30 can be exposed to a UV light source prior to the pick-and-place step to reduce the adhesiveness of carrier tape 30.

Figure 13:
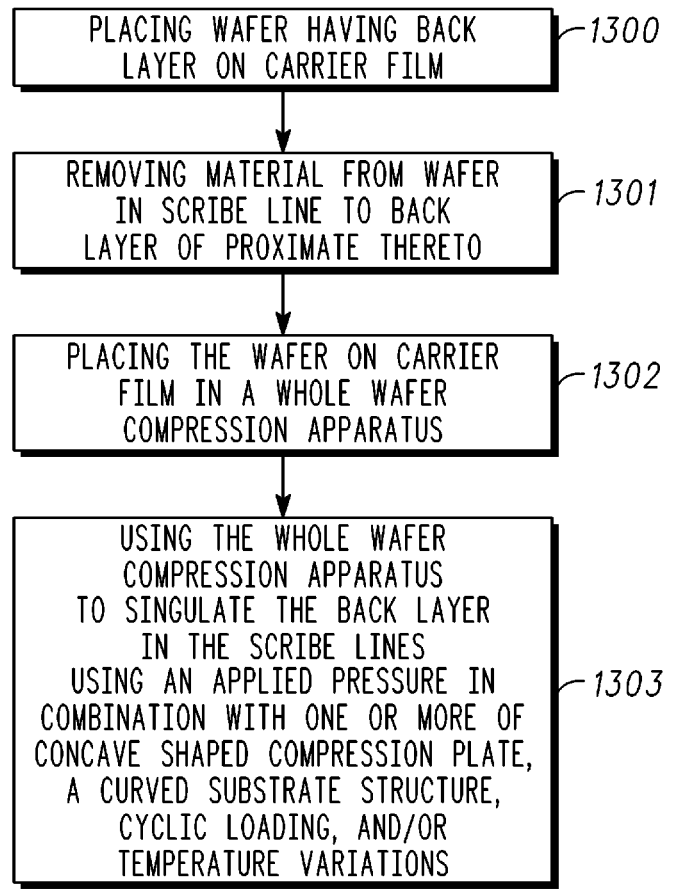
FIG. 13 illustrates a flow chart of a batch singulation method in accordance with an embodiment of the present invention.

FIG. 13 illustrates a flow chart for batch singulating a back layer in accordance with an embodiment. In step 1300, wafer 10 can be placed onto a carrier film, such as carrier tape 30, as generally illustrated in FIG. 2. In accordance with the present embodiment, wafer 10 includes a back layer, such as layer of material 28 or layer 28. In some embodiments, layer 28 is a conductive metal material. In other embodiments, layer 28 can be a Wafer Back Coat (WBC) film or a Die Attach Film (DAF), such as a die-attached coating or film or combinations of different films. In step 1301, material, such as semiconductor material, is removed from scribe lines 13, 15, 17, and 19, as generally illustrated in FIG. 5. Semiconductor material can be removed to expose layer 28 in scribe lines 13, 15, 17, and 19, or small amount of material can be left in scribe lines 13, 15, 17, and 19 as generally illustrated in FIG. 5. Stated another way, a sufficient amount of material is removed so that layer 28 can be effectively separated in scribe lines 13, 15, 17, and 19 in a subsequent step. In step 1302, wafer 10 on carrier tape 30 is placed in a whole wafer compression apparatus, such as apparatus 60 illustrated in FIGS. 6 and 7, apparatus 80 illustrated in FIG. 8, apparatus 90 illustrated in FIG. 9, or apparatus 1000 illustrated in FIG. 11. In some embodiments, wafer 10 is placed front side or device side down with back layer 28 and carrier tape 30 facing upward as illustrated in FIGS. 8, 9, 10, and 11. In other embodiments, wafer 10 is placed front side up with back layer 28 and carrier tape 30 facing downward as illustrated in FIGS. 6 and 7. It is understood that wafer 10 can be flipped in the various apparatus embodiments in alternative methods.

In step 1303 the whole wafer compression apparatus is used to separate or break away portions of layer 28 using a pressure applied to layer 28. In one embodiment, the pressure is applied in combination with one or more of a concave shaped compression plate (e.g., compression plate 71 illustrated in FIGS. 6. and 7), a curved substrate structure (e.g., substrate structure 91 illustrated in FIGS. 6 and 7, adjustable plunger structure 1469 illustrated in FIGS. 14-15), cyclic loading (e.g., transducer systems 736, 737 illustrated in FIGS. 6-11 and 14-15), and temperature variation (e.g., temperature variation systems 731, 732 illustrated in FIGS. 6-11 and 14-15). In some embodiments, the compression apparatus can be applied more than once to wafer 10 and the compression apparatus and/or wafer 10 can be rotated between each application. In some embodiments, pressure, mechanical vibrations, and temperature variations can be used in various combinations in one or more separation steps per wafer.

Figure 14:
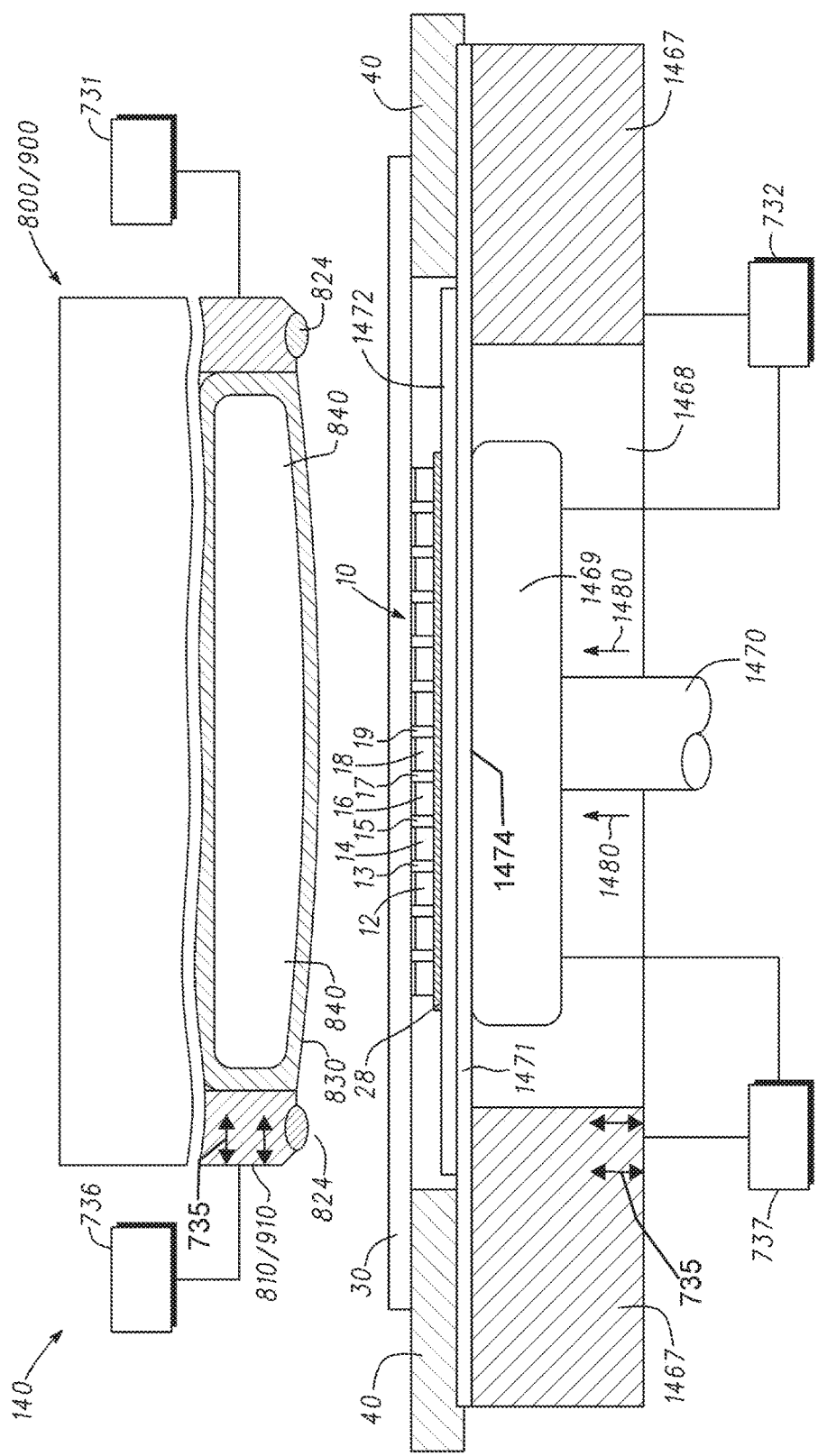
FIG. 14 illustrates a cross-sectional view of the wafer of FIG. 1 at a subsequent stage of singulation in accordance with a further embodiment of the present invention.
Figure 15:
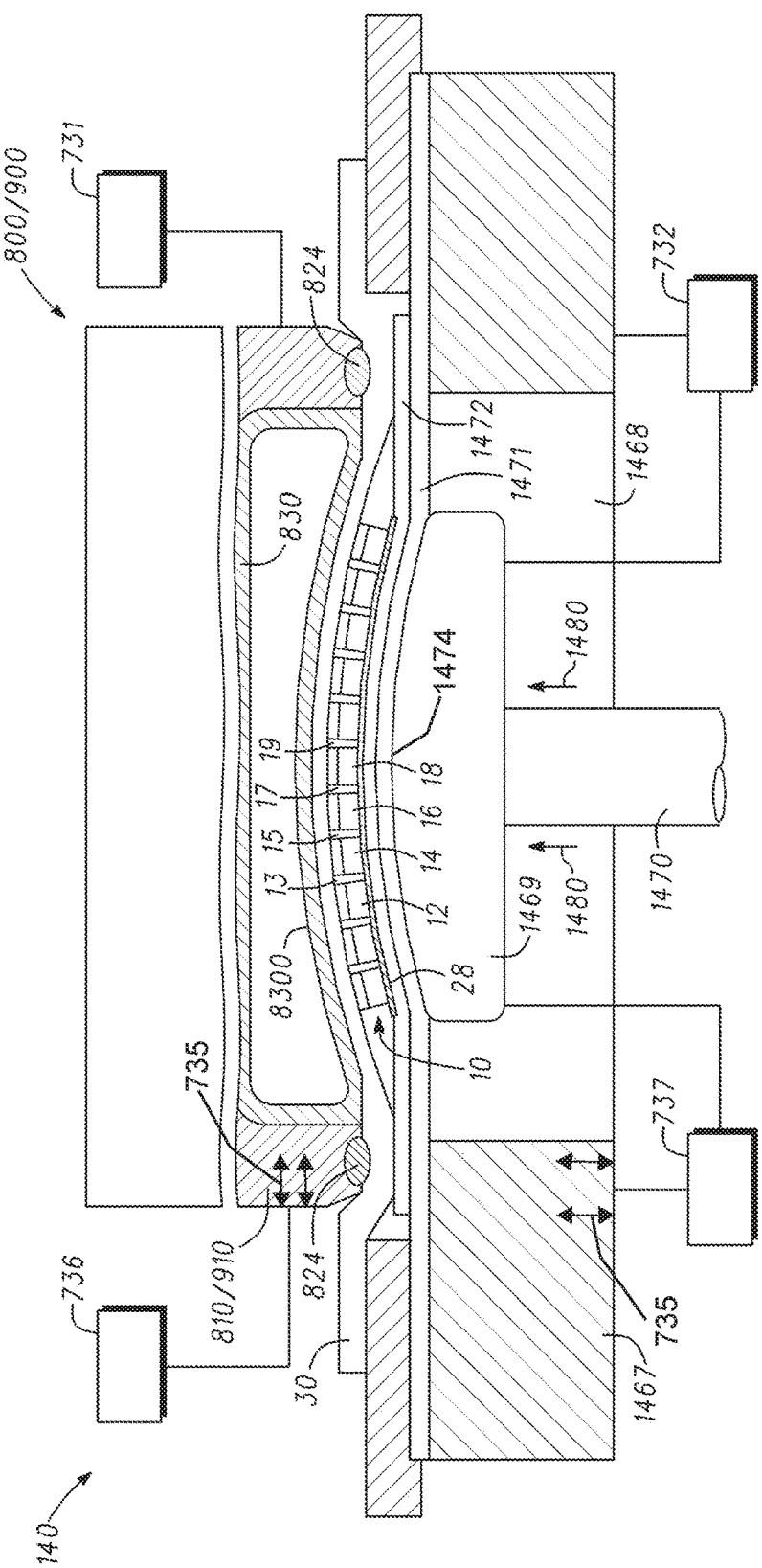
FIG. 15 illustrates a cross-sectional view of the wafer of FIG. 1 after further processing in accordance with the embodiment of FIG. 14.

FIG. 14 illustrates a cross-sectional view of a back layer separation apparatus 140 in accordance with a further embodiment, which can be configured to hold wafer 10 including frame 40 with carrier tape 30. FIG. 15 illustrates a cross-sectional view of apparatus 140 and wafer 10 at a subsequent step in fabrication in accordance with the present embodiment. In accordance with the present embodiment, apparatus 140 is configured as a whole wafer compression or back layer tool or system. In one embodiment, apparatus 140 can be used with compression structures 800 or 900 (only pressure transfer vessel 830, portions of containment structures 810/910, and seals 824 are illustrated). The additional details of compression structures 800 and 900 will not be repeated here. In other embodiments, compression structure 70 is used with apparatus 140.

In one embodiment, apparatus 140 also includes a protective film 1472 disposed adjacent to layer 28 and disposed adjacent to a plate structure 1471. In some embodiments, protective film 1472 can be a disposable polyester film provided on a roller. In some embodiments plate structure 1471 preferably comprises a spring steel or similar material(s) as known to those skilled in the art.

In accordance with the present embodiment, apparatus 140 further includes a support structure 1467 having a passage 1468 or hole portion 1468 passing through support structure 1467. Passage 1468 is provided to enable an adjustable plate structure 1469, adjustable plunger structure 1469, or plate structure 1469 to moveably pass through support structure 1467. More particularly, plate structure 1469 is moveably engaged (as represented by arrows 1480) within passage 1468 to push against one side of wafer 10 as compression structures 800/900 pushes against an opposite side of wafer 10. In one embodiment, a shaft 1470 is engaged with plate structure 1469 to move plate structure 1469 against wafer 10. Adjustable plate structure 1469 is referred to as adjustable because plate structure 1469 comprises an upper surface 1474 that is shapeable, formable, or that changes or adjusts its upper profile in a predetermined manner as illustrated in FIG. 15. In one embodiment, upper surface 1474 forms to have a convex shape in cross-sectional view as generally illustrated in FIG. 15, which results in surface 8300 of vessel 830 to have a concave shape in the cross-section view. In accordance with the present embodiment, and as illustrated in FIG. 15, compression structure 800/900 and adjustable plate structure 1469 are pushed up against wafer 10 to singulate, separate, and/or break layer 28 within the singulation lines of wafer 10, including singulation lines 13, 15, 17, and 19. In accordance with the present embodiment, adjustable plate structure 1469 is wider than the diameter of wafer 10. In some embodiments, adjustable plate structure 1469 comprises spring steel. Although layer 28 is illustrated adjacent to adjustable plate structure 1469, in other embodiments, wafer 10 can be flipped with layer 28 adjacent vessel 830.

Similar to apparatus 60, 80, and 90, in some embodiments, apparatus 140 is provided with one or more of temperature variations systems 731 and 732 and/or is provided with one or more of transducer systems 736 and 737 as described previously. In one embodiment, transducer system 736 can be engaged with portions of compression structures 800/900 to provide a cyclic load, pressure waves, or shear waves (represented in part by arrows 735) to layer 28. In one embodiment, transducer system 737 can be engaged with one or more of support structure 1467 and adjustable plate structure 1469 to provide a cyclic load, pressure waves, or shear waves (represented in part by arrows 735) to layer 28. In one embodiment, temperature variation system 731 can be engaged portions of compression structures 800/900. In a further embodiment, temperature variation system 732 can be engaged with one or more of support structure 1467 and adjustable plate structure 1469.

From all of the foregoing, one skilled in the art can determine that, according to one embodiment, a method of singulating a wafer (for example, element 10) comprises providing a wafer (for example, element 10) having a plurality of die (for example, elements 12, 14, 16, 18) formed on the wafer and separated from each other by spaces, wherein the wafer has first and second opposing major surfaces (for example, elements 21, 22), and wherein a layer of material (for example, element 28) is formed along the second major surface. The method comprises placing the wafer onto a carrier substrate (for example, element 30). The method comprises singulating the wafer through the spaces to form singulation lines (for example, elements 13, 15, 17, 19), wherein singulating comprises stopping in proximity to the layer of material. The method comprises providing an apparatus (for example, elements 60, 80, 90, 1000) comprising a compression structure, a support structure (for example, element 67, 867, 1067), and a transducer system configured to apply high frequency mechanical vibrations to the layer of material (for example, elements 736, 737). The method includes placing the wafer and the carrier substrate adjacent the support structure. The method includes applying pressure and mechanical vibrations to the wafer to separate the layer of material in the singulation lines.

From all of the foregoing, one skilled in the art can determine that, according to another embodiment, a method for singulating a semiconductor wafer comprises providing a semiconductor wafer (for example, element 10) having a plurality of die (for example, elements 12, 14, 16, 18) formed as part of the semiconductor wafer and separated from each other by spaces, wherein the semiconductor wafer has first and second opposing major surfaces (for example, elements 21, 22), and wherein a layer of material (for example, element 28) is formed along the second major surface. The method comprises placing the semiconductor wafer onto a carrier substrate (for example, element 30). The method comprises etching the semiconductor wafer through the spaces to form singulation lines (for example, elements 13, 15, 17, 19) and to expose portions of the layer of material in the singulation lines. The method comprises placing the semiconductor wafer and the carrier substrate atop a support structure (for example, elements 67, 867, 1067). The method comprises providing a pressure transfer vessel (for example, elements 73, 830) proximate to the semiconductor wafer, wherein the pressure transfer vessel contains a fluid (for example, elements 74, 840). The method includes moving a structure (for example, elements 71, 871) against the pressure transfer vessel thereby applying a pressure to the layer of material to separate the layer of material in the singulation lines, wherein the structure is wider than the semiconductor wafer, and the structure has a convex shape (for example, element 710) in cross-sectional view.

From all of the foregoing, one skilled in the art can determine that, according to an additional embodiment, a method of singulating a wafer comprising providing a wafer (for example, element 10) having a plurality of die (for example, elements 12, 14, 16, and 18) formed as part of the wafer and separated from each other by spaces, wherein the wafer has first and second opposing major surfaces, and wherein a layer of material (for example, element 28) is formed along the second major surface. The method comprises placing the wafer onto a carrier substrate (for example element 30) and singulating the wafer through the spaces to form singulation lines (for example, elements 13, 15, 17, 19), wherein singulating comprises leaving at least a portion of the layer of material within the singulation lines. The method includes placing the wafer and the carrier substrate adjacent a support structure (for example, 67, 867, 1067) and providing a compression structure (for example, elements 71, 73, 871, 830, 1004) having a lateral width greater than that of the wafer. The method includes using the compression structure to apply a pressure to the second major surface to separate the layer of material in the singulation lines. The method includes applying mechanical vibrations (for example, elements 736, 737, 1027, 1028, 1135) to the layer of material during at least a portion of the step of using the compression structure.

In view of all of the above, it is evident that a novel method and apparatus is disclosed. Included, among other features, providing a whole wafer separation apparatus that includes one more of a convex compression structure, a curved substrate structure, cyclic loading, and temperature variation to batch separate a layer of material on a partially singulated wafer. The method provides, among other things, an efficient, reliable, and cost effective process for batch singulating substrates that include back layers, such as thicker back metal layers or WBC or DAF layers.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes. Additionally, the orientation of wafer 10 in the various whole wafer compression embodiments can be flipped with respect to the orientation illustrated.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of singulating a wafer comprising:
providing a wafer having a plurality of die formed as part of the wafer and separated from each other by spaces, wherein the wafer has first and second opposing major surfaces, and wherein a layer of material is formed atop the second major surface, and wherein the layer of material comprises at least one of a conductive material, a wafer-back coating, and a die-attach film adapted to remain at least in part atop surfaces of the plurality of die upon completion of the method of singulating the wafer;
placing the wafer onto a carrier substrate;
etching portions of the wafer through the spaces to form singulation lines, wherein etching comprises stopping atop the layer of material;
providing an apparatus comprising a compression structure, a support structure, and a transducer system configured to apply high frequency mechanical vibrations to the layer of material;
placing the wafer and the carrier substrate adjacent the support structure; and
applying pressure and high frequency mechanical vibrations to the wafer to separate the layer of material in the singulation lines.

2. The method of claim 1, wherein providing the apparatus comprises providing the compression structure comprising a pressure transfer vessel containing a fluid.

3. The method of claim 2, wherein providing the apparatus comprises providing the apparatus further comprising:
a containment structure having sidewall portions in cross-sectional view that contain the pressure transfer vessel; and
a seal engaged with a surface of the containment structure facing the wafer, wherein the seal is configured to further contain the pressure transfer vessel during the step of applying pressure and mechanical vibrations.

4. The method of claim 3, wherein:
providing the compression structure comprises providing the containment structure with a chamber portion: and
applying the pressure comprises introducing a pressurized fluid into the chamber portion to push the pressure transfer vessel against the wafer.

5. The method of claim 3, wherein:
providing the compression structure comprises providing a compression plate within a chamber portion; and
applying the pressure comprises moving the compression plate against the pressure transfer vessel.

6. The method of claim 2, wherein providing the compression structure comprises providing a compression plate adjacent the pressure transfer vessel, wherein the compression plate comprises a convex shape in cross-sectional view.

7. The method of claim 1, wherein providing the apparatus comprises engaging the transducer system with one or more of the compression structure and the support structure.

8. The method of claim 1, wherein providing the apparatus comprises providing a temperature variation system configured for one or more of heating and cooling the wafer.

9. The method of claim 1, wherein applying the high frequency mechanical vibrations comprises providing the high frequency mechanical vibrations having a frequency in a range from about 10,000 Hz to about 30,000 Hz.

10. The method of claim 1, wherein providing the compression structure comprises providing a compression plate wider than the wafer and a shaft engaged with the compression plate configured for positioning the compression plate with respect to the wafer.

11. A method of singulating a semiconductor wafer comprising:
providing a semiconductor wafer having a plurality of die formed as part of the semiconductor wafer and separated from each other by spaces, wherein the semiconductor wafer has first and second opposing major surfaces, and wherein a layer of material is formed atop the second major surface, and wherein the layer of material comprises at least one of a conductive material, a wafer-back coating, and a die-attach film, and wherein the layer of material adapted to remain at least in part attached to the plurality of die upon completion of the method of singulating the semiconductor wafer;
placing the semiconductor wafer onto a carrier substrate;
etching through the spaces to form singulation lines to expose portions of the layer of material in the singulation lines;
placing the semiconductor wafer and the carrier substrate atop a support structure;
providing a pressure transfer vessel proximate to the semiconductor wafer, wherein the pressure transfer vessel contains a fluid; and
moving a structure against the pressure transfer vessel thereby applying a pressure to the layer of material to separate the layer of material in the singulation lines, wherein:
the structure is wider than the semiconductor wafer; and
the structure has a convex shape in cross-sectional view.

12. The method of claim 11, wherein placing the semiconductor wafer comprises placing the semiconductor wafer onto a carrier tape.

13. The method of claim 11, wherein placing the semiconductor wafer and carrier substrate atop the support structure comprises placing the semiconductor wafer adjacent a support structure having a convex shape in cross-sectional view.

14. The method of claim 11 further comprising applying mechanical vibrations having one or more frequencies in a range from about 10,000 Hz to about 30,000 Hz to the layer of material for at least a portion of the step of moving the structure.

15. The method of claim 11 further comprising varying the temperature of the semiconductor wafer for at least a portion of the step of moving the structure.

16. The method of claim 11, wherein:
placing the semiconductor wafer onto the carrier substrate comprises placing onto a carrier tape attached to a frame; and
moving the structure against the pressure transfer vessel thereby applying the pressure comprises applying a pressure in a range from about 34,000 kPa through about 138,000 kPa.

17. A method of singulating a wafer comprising:
providing a wafer having a plurality of die formed as part of the wafer and separated from each other by spaces, wherein the wafer has first and second opposing major surfaces, and wherein a layer of material is formed atop the second major surface, and wherein portions of the layer of material are adapted to remain atop surfaces of the plurality of die after completion of the method of singulating the wafer;
placing the wafer onto a carrier substrate;
singulating the wafer through the spaces to form singulation lines, wherein singulating comprises leaving at least a portion of the layer of material within the singulation lines; and placing the wafer and the carrier substrate adjacent a support structure;

providing a compression structure having a lateral width greater than that of the wafer;

using the compression structure to apply a pressure to the second major surface to separate the layer of material in the singulation lines; and applying mechanical vibrations to the layer of material during at least a portion of the step of using the compression structure.

18. The method of claim 17, wherein providing the compression structure comprises providing a pressure transfer vessel containing fluid.

19. The method of claim 18, wherein:

providing the compression structure comprises providing a compression plate adjoining the pressure transfer vessel;

the compression plate is configured to provide a downward pressure on the pressure transfer vessel;

the compression plate has a surface having a convex shape in cross-sectional view; and the pressure transfer vessel adjoins the surface having the convex shape.

20. The method of claim 17 further comprising varying the temperature of the semiconductor wafer during at least a portion of the step of using the compression structure.

* * * * *